United States Patent [19]

Ashikawa et al.

[11] 3,763,379

[45] Oct. 2, 1973

[54] SEMICONDUCTOR DEVICE FOR SCANNING DIGITAL SIGNALS

[75] Inventors: Mikio Ashikawa, Koganei; Takamitsu Kamiyama, Kokubunji, both of Japan

[73] Assignee: Hitachi, Ltd., Tokyo, Japan

[22] Filed: Dec. 7, 1971

[21] Appl. No.: 205,630

[30] Foreign Application Priority Data

Dec. 7, 1970 Japan............................ 45/107566

[52] U.S. Cl. ......... 307/221 C, 307/304, 317/235 B, 317/235 G

[51] Int. Cl. ............................................ G11c 11/40

[58] Field of Search ................ 307/205, 221 C, 251, 307/279, 304; 317/235

[56] References Cited

UNITED STATES PATENTS

| | | | |
|---|---|---|---|
| 3,378,688 | 4/1968 | Kabell | 317/235 |
| 3,430,112 | 2/1969 | Hilbourne | 317/235 |
| 3,378,783 | 4/1968 | Gibson | 317/235 |
| 3,676,727 | 7/1972 | Dalton | 313/66 |
| 3,657,573 | 4/1972 | Maute | 307/304 |
| 3,617,753 | 11/1971 | Kato | 317/235 |

FOREIGN PATENTS OR APPLICATIONS

| | | | |
|---|---|---|---|
| 4,430,057 | 12/1969 | Japan | 317/235 |
| 1,468,416 | 12/1966 | Germany | 317/235 |

*Primary Examiner*—John W. Huckert
*Assistant Examiner*—R. E. Hart
*Attorney*—Craig et al.

[57] ABSTRACT

A semiconductor device for scanning digital signals includes: a row of MOSFETs arranged on a semiconductor substrate, the threshold voltages of individual MOSFETs being different from each other and a conductive layer connecting the gate electrodes of all the MOSFETs and a means for applying a saw-tooth wave voltage to said conductive layer.

16 Claims, 6 Drawing Figures

INVENTORS

MIKIO ASHIKAWA,

TAKAMITSU KAMIYAMA

BY

Craig, Antonelli & Hill

ATTORNEYS

INVENTORS
MIKIO ASHIKAWA,
TAKAMITSU KAMIYAMA
BY Craig, Antonelli & Hill
ATTORNEYS

SEMICONDUCTOR DEVICE FOR SCANNING DIGITAL SIGNALS

DETAILED DESCRIPTION OF THE INVENTION

1. Field of the Invention

This invention relates to a novel semiconductor device capable of scanning, one-dimensionally or two-dimensionally, digital signals.

2. Description of the Prior Art

A device for scanning one-dimensionally or two-dimensionally digital signals is utilized in an input-output device for a computer, a facsimile device, a television camera, a display device, a character and numerical indicator, etc. For this purpose, a shift register of an MOS type or bipolar type has been used.

In the prior art, the shift register needs four or more transistor elements per bit. Therefore, with an increase in the number of bits, a larger number of elements must be used for the shift register. To form the transistor elements into an integrated circuit, highly specialized techniques are required and the yield rate in the production of shift registers is decreased. Furthermore, in a digital scanning shift register, the failure of one bit disables the shift register from shifting the next stage bit, to stop the register function.

In view of the foregoing, a general object of this invention is to provide a semiconductor device for scanning digital signals, which has a novel structure with a minimized number of elements and manufacturable by simplified production process.

SUMMARY OF THE INVENTION

Briefly, the semiconductor device of this invention comprises a plurality of insulated gate field effect transistors having different threshold voltages, a conductor layer connected with the gate electrodes of the individual field effect transistors, and a variable voltage-applying means connected to the conductor layer, wherein, when a voltage varying in value with time, such as, for example, a voltage with a saw-tooth waveform, is supplied to the conductor layer, the field effect transistors are sequentially turned into the ON state or the OFF state from that transistor having a low threshold voltage to a transistor having a high threshold voltage.

More specifically, the transistors are arranged in order in a row from a transistor having a low threshold voltage to such a transistor having a high threshold voltage, the gate electrodes of the individual transistors are connected to each other by a conductor layer, and a saw-tooth wave voltage is applied to the conductor layer, whereby the states of each transistor are sequentially changed from OFF to ON or from ON to OFF with time and, when the saw-tooth wave voltage exceeds a certain value, all the transistors are turned ON. Therefore, the region of the ON state transistors in a row increases by applying a saw-tooth wave voltage to the conductor layer with time. In case a saw-tooth wave voltage, the value of which is reduced with time, is applied to the conductor layer, all the ON-state transistors are switched to the OFF-state, in succession.

Thus, by combining the above-mentioned two-operations, it is possible to scan a certain limited ON-region in the direction of one-dimension along to X- and Y- axis direction, respectively, and the limited ON-region may be scanned in two dimensions.

According to this invention, a known method is employed to control the threshold voltage of each field effect transistor. For example, when an insulated gate field effect transistor is used, the threshold voltage is changed by changing the thickness of the insulation layer located directly beneath the gate electrode. Further, another method for changing the threshold voltage of individual field effect transistors arranged in rows is to control the amount of metallic ions which are doped in the insulating layer (referred to as the gate insulator layer) on the surface of a semiconductor substrate between the source and the drain regions by a well known method such as the ion implantation method.

In a junction type field effect transistor, the specific resistance of the semiconductor substrate is changed to change the threshold voltage.

When an insulated gate field effect transistor is the element used for the purpose of this invention, the elements may be integrated on a semiconductor wafer by utilizing a process for forming the insulation layer, as will be described in this specification.

The invention will be better understood from the following detailed description taken in conjunction with the accompanying drawings.

Brief Description of the Drawings

Referring to FIGS. 1 through 3, there is illustrated a semi-conductor device in which a plurality of insulated gate field effect transistors are disposed on a semiconductor substrate in rows, and the gate electrodes of the individual transistors are connected to each other by a conductor layer. In this device, when a saw-tooth wave voltage is applied to the conductor layer, the region of ON state transistors in rows increases or decreases with time.

In FIGS. 1–3 the reference numeral 1 denotes an n-type silicon substrate, 2 and 3 p-type source and drain regions respectively, disposed on the substrate by p-type impurity diffusion, 4 and 5 source and drain electrodes respectively, connected to the source and drain regions through openings on an insulation layer 6 (e.g., $SiO_2$ layer) disposed on the substrate, 7 a gate electrode disposed on a thin insulation layer 8 (e.g., $SiO_2$ layer), called gate insulation layer, located on the semiconductor region (called the gate region or channel region) between the source and drain regions, $9_1, 9_2 \ldots 9_n$ and $10_1, 10_2 \ldots 10_n$ conductive metal layers electrically connected to the source electrodes and drain electrodes of the individual field effect transistors, which metal layers serve to draw out the source and drain electrodes, and 11 a conductor layer electrically connecting the gates of the individual transistors to each other.

As shown in FIG. 3, the thicknesses of the gate insulation layers located directly beneath the gate electrodes of the transistors are different from each other.

The threshold voltage $V_{th}$ of an insulated gate field effect transistor is expressed as: $V_{th} = (QsTox/\epsilon)$, wherein Qs denotes the quantity of electric charge induced on the surface of the substrate, *Tox* denotes a thickness of the gate insulator layer, and $\epsilon$ is the dielectric constant of the insulation layer, on condition that an insulation layer is deposited on the semiconductor substrate. Therefore, the threshold voltage $V_{th}$ increases in proportion to *Tox*.

Figure 1:
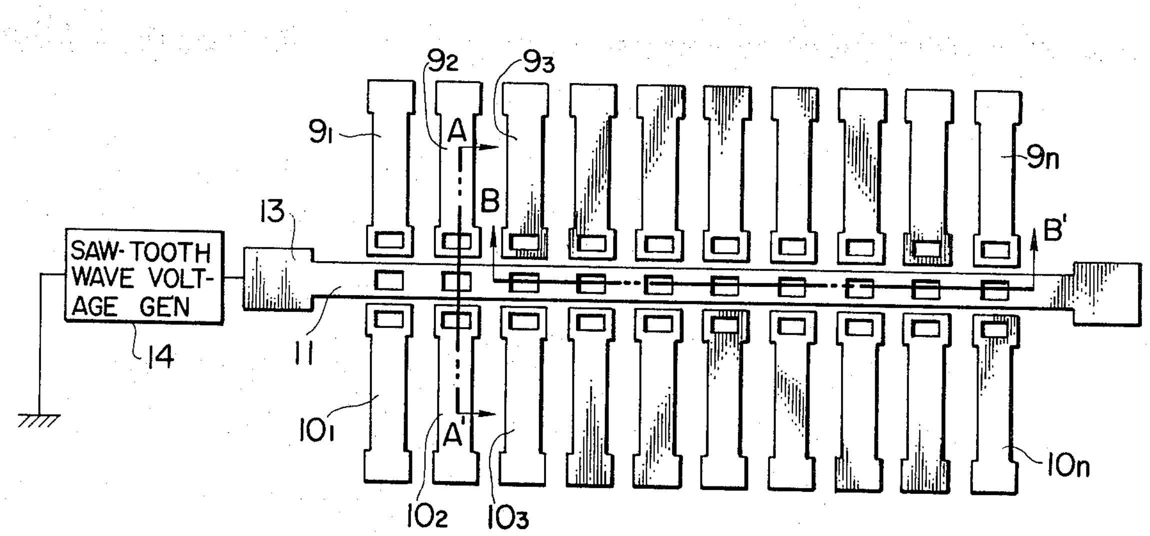
FIG. 1 is a top view showing a semiconductor device according to this invention.
Figure 2:
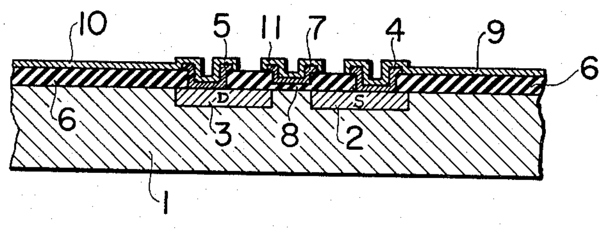
FIG. 2 is an enlarged sectional view taken across line A—A' in FIG. 1.
Figure 3:
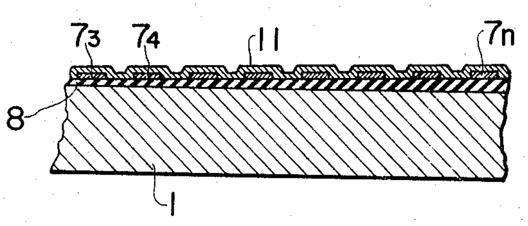
FIG. 3 is an enlarged sectional view taken across line B—B' in FIG. 1.

The insulated gate field effect transistors shown in FIG. 1 have threshold voltages different from each other, and the gate insulation layers are thicker from one end to the other. This means that the transistors in FIG. 1 are arranged in order from low to high threshold voltage.

Figure 4:
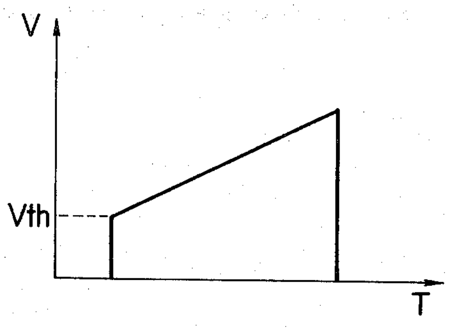
FIG. 4 and FIG. 5 show saw-tooth voltage waveforms applied to the device in FIG. 1.

In FIG. 1, it is assumed that a saw-tooth wave generator 14 is connected to one end 13 of the conductor metal connecting the gate electrodes to each other, and a saw-tooth wave voltage as in FIG. 4 is supplied to terminal 13. By this arrangement, a saw-tooth wave voltage is applied to the gate electrodes of all the field effect transistors in FIG. 1, and the transistors are turned on in succession from one end to the other with time.

Figure 5:
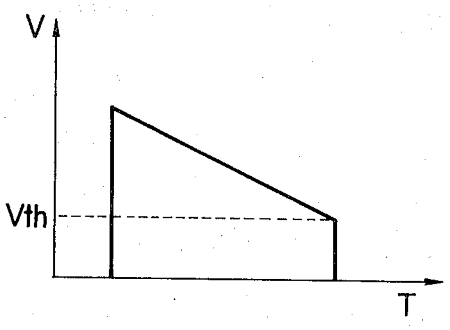

When a saw-tooth wave voltage as in FIG. 5 is applied to terminal 13, all the transistors are turned ON initially and then are turned OFF from one end to the other, sequentially.

The device as shown in FIG. 1 is produced in the following manner. First, the source and drain regions of the individual field effect transistors are formed on a semiconductor substrate through the mask of the $SiO_2$ film in such a manner that resultant field effect transistors are arranged in a row. Then, the $SiO_2$ film is removed from the surface of the substrate, the semiconductor substrate is heated to 700° to 800°C in an oxide atmosphere containing silane vapor, whereby a relatively thick (e.g., about $1\mu$ thick) $SiO_2$ layer is formed on the substrate. Then the $SiO_2$ layer is removed from at least the gate region of individual field effect transistors. Again, by silane thermal decomposition method, an $SiO_2$ layer is deposited on the groove in such a manner that the semiconductor substrate is heated so that the temperature is highest at one end of the wafer and becomes lower toward the other end. By this process, a certain gradient is given to the $SiO_2$ layer formed on the gate region of individual field effect transistor. Then gate electrodes are disposed on this $SiO_2$ layer, openings are disposed on the $SiO_2$ layer in the areas corresponding to the source and drain regions of the transistors, and the individual source and drain electrodes are formed through said openings.

A conductor layer is deposited on the row of field effect transistors formed in the foregoing manner, whereby a device as in FIG. 1 is realized.

Figure 6:
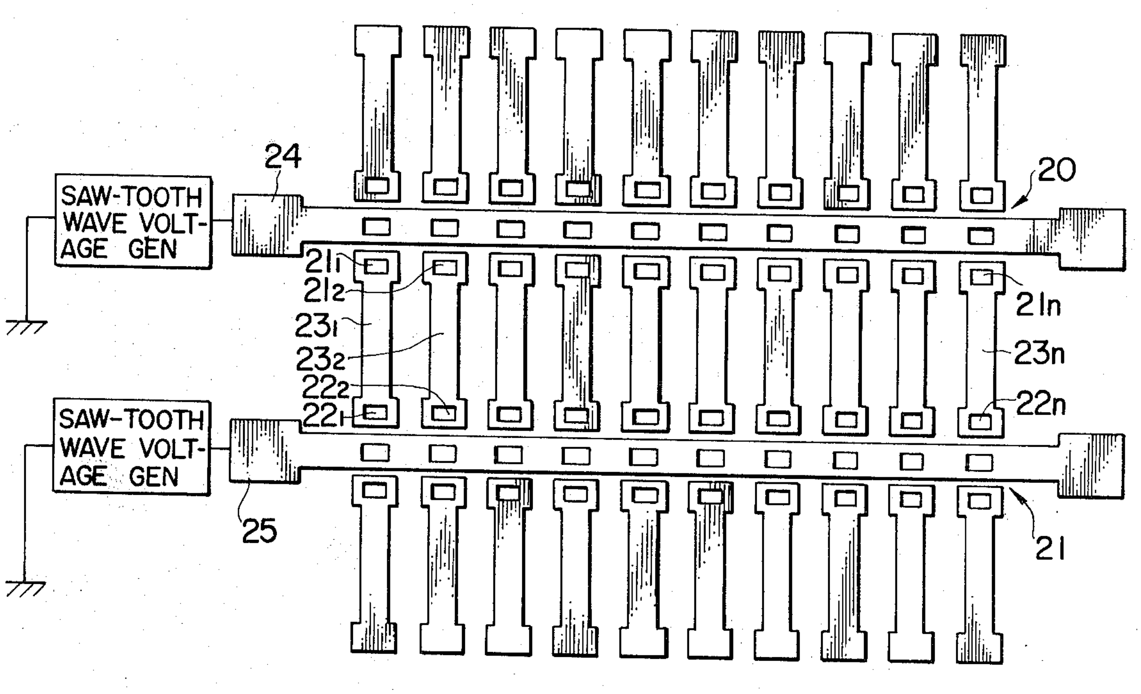
FIG. 6 is a top view showing a device capable of scanning digital signals one-dimensionally by using two of the circuit devices shown in FIG. 1.

FIG. 6 shows a semiconductor device comprising two devices 20 and 21 in combination, each device being the same as that shown in FIG. 1. It is assumed that, in the device 20, the threshold voltage is lowest in the leftmost field effect transistor and becomes higher toward the right. Also, in the circuit device 21, the threshold voltage is highest in the left most transistor and becomes lower toward the right. The source electrodes $21_1$, $21_2$...$21_n$ of the circuit device 20 are connected to the drain electrodes $22_1$, $22_2$,...$22_n$ of the circuit device 21 by the conductors $23_1$, $23_2$...$23_n$.

When a saw-tooth wave voltage as in FIG. 4 is applied to the terminal 24 of the device 20, and a saw-tooth wave voltage as in FIG. 5 is applied to the terminal 25 of the device 21, the field effect transistors in the device 20 are turned ON from the left to the right with the passage of time, and those in the device 21 are turned OFF from the left to the right. If the saw-tooth wave voltage is determined so that the ON regions of the devices 20 and 21 partly overlap each other (for example, the ON regions overlap in a pair of transistors) as shown in the embodiment of FIG. 6, the ON region is scanned one-dimensionally with the passage of time.

For two-dimensional scanning, two of the device as in FIG. 6 are used. One of the two is used for the scanning in the X-axis direction, and the other for the scanning in the Y-axis direction. Thus a circuit device capable of two-dimensional scanning can be realized.

While one specific embodiment of the invention has been described above, it is apparent that various modifications thereof may be made. For example, a voltage-controlled element may be used instead of insulated gate field effect transistor.

What we claim is:

1. A semiconductor scanning device comprising:

a row of plurality of metal-oxide-semiconductor field effect transistors, each transistor having a source, a gate and a drain region and a respective electrode connected thereto, disposed with substantially the same distance between each field effect transistor on one surface of a semiconductor substrate, with the respective gate threshold voltages of said transistor substantially linearly increasing with distance from the lowest level at the transistor at one end of said row to the highest level at the transistor at the other end of said row;

first means for successively electrically interconnecting the gate electrodes of each of said transistors along said row;

second means, connected to the respective source and drain electrodes of each transistor, for supplying electric current thereto; and third means, connected to the interconnected gate electrodes of each of said transistors, for applying pulses of a saw-tooth waveform thereto, the height of said waveform varying in a substantially linear manner between a maximum value and a minimum value with respect to time, said maximum value being of a first sufficient magnitude to permit current flow between the source and drain electrode of the transistor at said other end of said row, and said minimum value being of a second sufficient magnitude to permit current flow between the source and drain electrode of only the transistor at said one end of said row, whereby the number of field effect transistors in which electric current flows between the source and drain electrodes thereof varies linearly with respect to time.

2. A semiconductor scanning device for scanning digital signals in accordance with claim 1, wherein the gate insulator layers of individual field effect transistors are different from each other in thickness.

3. A semiconductor scanning device for scanning digital signals in accordance with claim 1, wherein the gate insulator layers of individual field effect transistors include different amounts of metallic ion with respect to each other.

4. A semiconductor scanning device comprising:

a first and a second row of a plurality of metal-oxide semiconductor type field effect transistors, each transistor having a source, a gate and a drain region and a respective electrode connected thereto, disposed with substantially identical distances therebetween on one surface of a semiconductor substrate, said first and second rows having a same number N of transistors, the gate threshold voltage being lowest for the first and highest for the last of said field effect transistors of the rows and varying substantially linearly with distance from one end of each row to the other end thereof;

first means for successively interconnecting the gate electrode of each field effect transistor to that of the gate electrode of a succeeding transistor;

second means for connecting the source electrode of the *n*th field effect transistor of the first row of the drain electrode of the $(N - n + 1)^{th}$ field effect transistor of the second row, *n* being a positive integer not greater than *N;* third means, connected to the respective drain electrode of the $n^{th}$ field effect transistor of the first row and the source electrode of the $(N - n + 1)^{th}$ field effect transistor of the second row, for supplying an electric current thereto;

fourth means, connected to the respective interconnected gate electrodes of the transistors of said first row,for applying electric pulses of a first saw-tooth waveform, the height of which increases linearly from a minimum to a maximum value with respect to time, said maximum value being of a first sufficient magnitude to permit electric current to flow between the drain and the source electrode of the $N^{th}$ field effect transistor, said minimum value being of a second sufficient magnitude to permit electric current to flow between the drain and the source electrode of only the first field effect transistor of the first row, so that the number of field effect transistors in which electric current flows between the drain and the source electrode increases substantially linearly with time; and fifth means, connected to the respective interconnected gate electrodes of the transistors of said second row, for applying electric pulses of a second saw-tooth waveform, the height of which decreases linearly from a maximum to a minimum value with time, said maximum value being of a first sufficient level to permit electric current to flow between the drain and the source electrode of the $N^{th}$ field effect transistor, said minimum value being of a second sufficient level to permit the electric current to flow between the drain and the source electrode of only the first field effect transistor of said second row, so that the number of field effect transistors in which electric current flows between the drain and the source electrode decreases substantially linearly with respect to time and so that a field effect transistor through which electric current flows shifts from one end to the other of the rows with a substantially constant velocity.

5. A semiconductor scanning device for scanning digital signals in accordance with claim 4, wherein the gate insulator layers of individual field effect transistors are different from each other in the thickness.

6. A semiconductor scanning device for scanning digital signals in accordance with claim 4, wherein the gate insulator layers of individual field effect transistors include different amounts of metallic ion with respect to each other.

7. A semiconductor scanning device comprising:

a plurality of voltage sensitive switching elements, arranged sequentially adjacent to one another, each having an input electrode, an output electrode and a control electrode, the application of a voltage to the control electrode of an element of a predetermined magnitude causing a conductive path to be provided between said input and output electrodes, whereby a signal supplied to said input electrode may be provided at the output electrode, and the voltage at which a conductive path is provided between an input electrode and an output electrode of the respective element being defined as the threshold voltage for said element, the threshold voltage of at least two of said elements in said plurality differing from each other;

means for supplying a control voltage to the control electrodes of said plurality of comments simultaneously, the magnitude of which varies with time, whereby said at least two of said elements will be switched ON to provide a conductive path between their respective input and output electrodes at different instants of time, and wherein each of said voltage sensitive switching elements comprises a field effect transistor, the source and drain electrodes of which correspond to said input and output electrodes and the gate electrode of which corresponds to said control electrode, wherein said voltage sensitive switching elements are disposed in two parallel rows on a common substrate, into which the respective source and drain regions and the electrodes therefor of said field effect transistors are formed, and wherein the source and the drain of a respective field effect transistor adjacent another field effect transistor in separate rows are connected together, the common connected gate electrodes being in the form of respective longitudinal conductive layers disposed on each gate insulator layer of respective field effect transistor in a parallel row, and wherein the thickness of said insulator layer is different for adjacent field effect transistors, to thereby provide different threshold voltages therefor.

8. A semiconductor scanning device according to claim 7, wherein the thickness of the gate insulator layer for a respective row varies from one end of said longitudinal gate electrode to the other.

9. A semiconductor scanning device according to claim 7, wherein the ion dopant concentration of the gate insulator layer varies from one end of said longitudinal electrode to the other.

10. A semiconductor scanning device according to claim 7, including means for supplying first and second saw-tooth wave voltages to the longitudinal gate electrode layers of respective parallel rows of field effect transistors.

11. A method of forming a field effect transistor scanning device comprising the steps of:

a. forming, in a first surface of a semiconductor substrate having a first conductivity type, a plurality of adjacent regions of a second conductivity type;

b. providing a first insulator layer over said plurality of regions of said second conductivity type on said first surface of said substrate;

c. forming a second insulator layer over the first surface of said substrate between said plurality of regions, the electronic characteristics of said second insulator layer varying in the direction along which said plurality of regions are formed, by thermally decomposing a material into which said second insulator layer is formed, by maintaining the temperature during said decomposition for a first portion of said substrate different from the temperature for a second portion of said substrate ;

d. applying a plurality of electrodes to each individual one of said adjacent regions on said first surface, said electrodes being deposited on said first insulator layer and extending therethrough to said regions; and e. applying a single electrode to said second insulator layer so as to provide a common scanning element for each respective pair of adjacent regions between which said second insulator layer of varying electronic characteristics is disposed.

12. A method of forming a field effect transistor scanning device comprising the steps of:

a. forming, in a first surface of a semiconductor substrate having a first conductivity type, a plurality of adjacent regions of a second conductivity type;

b. providing a first insulator layer over said plurality of regions of said second conductivity type on said first surface of said substrate;

c. forming a second insulator layer over the first surface of said substrate between said plurality of regions, the electronic characteristics of said second insulator layer varying in the direction along which said plurality of regions are formed, by forming said second insulator layer of varying ionic concentration in said direction;

d. applying a plurality of electrodes to each individual one of said adjacent regions on said first surface, said electrodes being deposited on said first insulator layer and extending therethrough to said regions; and e. applying a single electrode to said second insulator layer so as to provide a common scanning element for each respective pair of adjacent regions between which said second insulator layer of varying electronic characteristics is disposed.

13. A semiconductor device comprising:

a semiconductor substrate having a first conductivity type and having a main surface;

a plurality of pairs of semiconductor regions of a second conductivity type opposite to said first conductivity type disposed in the main surface of said substrate, each pair of regions being spaced apart and each region of each pair being spaced with respect to each other;

a first layer of insulator material disposed over each of said pairs of regions and on said substrate, except for that portion of the substrate between the regions of said pairs of regions;

a plurality of pairs of electrodes extending through said first layer of insulator material and contacting said respective pairs of regions;

a second layer of insulator material disposed on said substrate overlying the portion thereof between the regions of said pairs of regions not covered by said first layer of insulator material, wherein the electronic characteristics of at least two portions of said second layer disposed between the regions of a pair are different for different pairs of regions; and an electrode layer disposed on said second layer of insulator material and extending continuously to overlie each portion of said substrate disposed between the regions of each pair of regions.

14. A semiconductor device according to claim 13, wherein the thickness of said second layer of insuating material is different for said at least two different portions.

15. A semiconductor device according to claim 14, wherein the thickness of said insulator material varies increasingly in the direction along said electrode layer.

16. A semiconductor device according to claim 13, wherein said second insulator layer has the dopant concentration thereof varying continuously over the length thereof beneath said electrode layer.

* * * * *